(12) United States Patent
Yu et al.

(10) Patent No.: US 12,317,702 B2
(45) Date of Patent: May 27, 2025

(54) DISPLAY PANEL, DISPLAY DEVICE AND METHOD FOR MANUFACTURING DISPLAY PANE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Chi Yu, Beijing (CN); Bo Shi, Beijing (CN); Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 809 days.

(21) Appl. No.: 17/595,806

(22) PCT Filed: Feb. 22, 2021

(86) PCT No.: PCT/CN2021/077233
§ 371 (c)(1),
(2) Date: Nov. 24, 2021

(87) PCT Pub. No.: WO2022/174443
PCT Pub. Date: Aug. 25, 2022

(65) Prior Publication Data
US 2023/0345776 A1     Oct. 26, 2023

(51) Int. Cl.
*H10K 59/131*     (2023.01)
*H10K 59/35*     (2023.01)
(Continued)

(52) U.S. Cl.
CPC ......... *H10K 59/131* (2023.02); *H10K 59/352* (2023.02); *H10K 59/353* (2023.02); *H10K 59/65* (2023.02); *H10K 71/421* (2023.02)

(58) Field of Classification Search
CPC .................................................. H10K 59/131
See application file for complete search history.

(56) References Cited

U.S. PATENT DOCUMENTS

2014/0120796 A1   5/2014  Kim et al.
2014/0299866 A1  10/2014  Ruske et al.
(Continued)

FOREIGN PATENT DOCUMENTS

CN       203456462 U    2/2014
CN       103774087 A    5/2014
(Continued)

OTHER PUBLICATIONS

Extended European Search Report for Application No. 21926160.9-1212, dated Jul. 4, 2023, 9 Pages.

*Primary Examiner* — Douglas M Menz
(74) *Attorney, Agent, or Firm* — BROOKS KUSHMAN P.C.

(57) ABSTRACT

A display panel, a display device, and a method for manufacturing the display panel. The display panel includes a base substrate. The base substrate includes a display area and a functional area, the functional area includes a light-transmitting region, the light-transmitting region includes a plurality of pixel units, and the plurality of pixel units is capable of emitting white light. Each of the pixel units includes at least one sub-pixel, each of the pixel units further includes a cathode, orthographic projections of a plurality of cathodes onto the base substrate are separated from each other, and an orthographic projection of an effective light-emitting area of each of the sub-pixels onto the base sub- (Continued)

strate is within the orthographic projection of the cathode of a corresponding one of the pixel units onto the base substrate.

16 Claims, 8 Drawing Sheets

(51) Int. Cl.
  *H10K 59/65* (2023.01)
  *H10K 71/40* (2023.01)

(56) References Cited

U.S. PATENT DOCUMENTS

| | | |
|---|---|---|
| 2020/0124927 A1 | 4/2020 | Kim et al. |
| 2020/0212164 A1 | 7/2020 | Xie et al. |
| 2020/0251539 A1* | 8/2020 | Fu .......................... H10K 59/12 |
| 2020/0258947 A1 | 8/2020 | Chung et al. |
| 2020/0286972 A1 | 9/2020 | Seo et al. |
| 2021/0118960 A1 | 4/2021 | Hou et al. |
| 2021/0359246 A1 | 11/2021 | Sun |
| 2021/0408439 A1 | 12/2021 | Wang |

FOREIGN PATENT DOCUMENTS

| | | |
|---|---|---|
| CN | 103890993 A | 6/2014 |
| CN | 109957754 A | 7/2019 |
| CN | 110391348 A | 10/2019 |
| CN | 110429117 A | 11/2019 |
| CN | 110444125 A | 11/2019 |
| CN | 110473898 A | 11/2019 |
| CN | 110473989 A | 11/2019 |
| CN | 110611054 A | 12/2019 |
| CN | 110767697 A | 2/2020 |
| CN | 111554702 A | 8/2020 |
| CN | 112164714 A | 1/2021 |
| KR | 20200044245 A | 4/2020 |
| WO | 2021012400 A1 | 1/2021 |
| WO | 2021017320 A1 | 2/2021 |

* cited by examiner

DISPLAY PANEL, DISPLAY DEVICE AND METHOD FOR MANUFACTURING DISPLAY PANE

CROSS-REFERENCE TO RELATED APPLICATION

This application is the U.S. national phase of PCT Application No. PCT/CN2021/077233 filed on Feb. 22, 2021, which is incorporated herein by reference in its entirety.

TECHNICAL FIELD

The present disclosure relates to the field of display technologies, in particular to a display panel, a display device and a method for manufacturing the display panel.

BACKGROUND

OLED (Organic light-emitting diode) display technology has the advantages such as high brightness, low power consumption, fast response, and high definition. With the development and maturity of OLED (Organic light-emitting diode) display technologies, OLED display devices are becoming more and more popular with users.

SUMMARY

In a first aspect, embodiments of the present disclosure provide a display panel, including a substrate, the substrate includes a display area and a functional area. The functional area includes a light-transmitting region, the light-transmitting region includes a plurality of pixel units, and the plurality of pixel units is capable of emitting white light; each of the pixel units includes at least one sub-pixel, each of the pixel units further includes a cathode, orthographic projections of a plurality of cathodes onto the base substrate are separated from each other, and an orthographic projection of an effective light-emitting area of each of the sub-pixels onto the base substrate is within the orthographic projection of the cathode of a corresponding one of the pixel units onto the base substrate; and the display panel further includes connection structures, the connection structures and the cathodes are arranged on a same layer, and different cathodes are connected via the connection structures.

Optionally, an orthographic projection of an edge of the cathode onto the base substrate is separated from the orthographic projection of the effective light-emitting area of a sub-pixel corresponding to the cathode onto the base substrate, and the orthographic projection of the edge of the cathode onto the base substrate overlaps an orthographic projection of an anode of the sub-pixel corresponding to the cathode onto the base substrate.

Optionally, an orthographic projection of an anode of the at least one sub-pixel included in each of the pixel units onto the base substrate is located within the orthographic projection of the cathode of the pixel unit onto the base substrate.

Optionally, an orthographic projection of an edge of the anode onto the base substrate partially overlaps the orthographic projection of the edge of the corresponding cathode onto the base substrate.

Optionally, in an area outside an area where the orthographic projection of the anode onto the base substrate overlaps the orthographic projection of the corresponding cathode onto the base substrate, the orthographic projection of the edge of the cathode onto the base substrate extends along a straight line.

Optionally, a chamfering process is performed on each edge of the cathode, and each edge chamfer of the cathode is larger than 30 degrees.

Optionally, the plurality of cathodes and the connection structures of the light-transmitting region form a mesh structure, the mesh structure includes a plurality of openings, each of the openings is surrounded by the cathodes and the connection structures, and the cathodes and the connection structures are made of a same material.

Optionally, the plurality of cathodes are arranged in a first direction to form a plurality of rows of cathodes, the plurality of rows of cathodes are arranged in a second direction, an angle between the first direction and the second direction ranges from 80 to 100 degrees, and two adjacent rows of cathodes are staggered in the first direction.

Optionally, the functional area further includes a transition region and a pixel circuit region, the pixel circuit region is around the light-transmitting region, and the transition region is arranged between the pixel circuit region and the light-transmitting region; and the transition region and the pixel circuit region share a cathode, and an orthographic projection of the cathodes onto the base substrate in the transition region and the pixel circuit region is a solid pattern.

Optionally, the display panel further includes a plurality of arc-shaped winding wires, the winding wires extend along an edge of the light-transmitting region, and the winding wires are coupled to pixel circuits located in the pixel circuit region via wires in the transition region.

Optionally, the display panel further includes a semiconductor layer, the semiconductor layer includes a plurality of dummy patterns in the transition region, and the dummy patterns are arranged at intervals and in an array.

Optionally, the display panel further includes a first gate layer between the semiconductor layer and an anode layer, the first gate layer includes a plurality of first transfer wires located in the transition region, and each of the first transfer wires has a size in the second direction greater than a size in the first direction; the plurality of the first transfer wires is arranged in the first direction and parallel to each other, and orthographic projections of the first transfer wires onto the base substrate are separated from orthographic projections of the dummy patterns onto the base substrate.

Optionally, the display panel further includes a second gate layer located between the first gate layer and the anode layer, where the second gate layer includes a plurality of second transfer wires located in the transition layer, and each of the second transfer wires has a size in the second direction larger than a size in the first direction, and orthographic projections of the second transfer wires onto the base substrate are separated from both the orthographic projections of the dummy patterns onto the base substrate and the orthographic projections of the first transfer wires onto the base substrate; and a ratio of a distance between two adjacent first transfer wires to a distance between two adjacent second transfer wires ranges from 0.8 to 1.2.

Optionally, the display panel further includes an intermediate insulation layer between the second gate layer and the anode layer, in the transition region, the intermediate insulation layer includes a plurality of via holes, and an orthographic projection of each of the via holes onto the base substrate overlaps an orthographic projection of one of the dummy patterns onto the base substrate.

Optionally, the display panel further includes a first metal layer between the intermediate insulation layer and the anode layer, where in the transition region, the first metal layer includes a plurality of third transfer wires, a size of each of the third transfer wires in the first direction is larger than a size of the third transfer wire in the second direction; and an angle between an orthographic projection of the third transfer wire onto the base substrate and the orthographic projection of the first transfer wire onto the base substrate is within a range of 80 to 100 degrees, and the orthographic projections of the third transfer wires onto the base substrate are separated from the orthographic projections of the dummy patterns onto the base substrate.

Optionally, the display panel further includes a transparent wire layer between the first metal layer and the anode layer, where the transparent wire layer includes transparent wires and first dummy wires extending along the first direction, the transparent wires are separated from the first dummy wires, and the transparent wire layer further includes a plurality of second dummy wires extending along the second direction.

Optionally, each anode is coupled to one of the transparent wires through an anode hole, the transparent wires are coupled to the pixel circuits in the pixel circuit region, and the first dummy wires and the second dummy wires are connected.

Optionally, the sub-pixels corresponding to each of the pixel units include two green sub-pixels, one red sub-pixel, and one blue sub-pixel, the two green sub-pixels are arranged along the second direction, and an effective light-emitting area of the blue sub-pixel is located between effective light-emitting areas of the two green sub-pixels in the second direction.

Optionally, center lines of the effective light-emitting areas of the two green sub-pixels along the second direction approximately coincide, and the effective light-emitting areas of the blue sub-pixel and an effective light-emitting areas of the red sub-pixel are located on a same side of the center line.

In a second aspect, embodiments of the present disclosure provide a display device, which includes the display panel according to the first aspect, and a camera arranged in the light-transmitting region.

In a third aspect, embodiments of the present disclosure provide a method for manufacturing a display panel, used to manufacture the display panel according to the first aspect. The method includes forming a cathode, and the forming the cathode includes: forming a cathode material layer; burning the cathode material layer with a laser to pattern the cathode material layer; and removing residual particles from the cathode material layer by using a plasma air knife.

Optionally, the burning the cathode material layer with the laser to pattern the cathode material layer includes:
  setting the display substrate including the cathode material layer on a processing platform of a laser etching device;
  capturing an alignment mark on the display substrate by using the laser etching device; and
  burning the cathode material layer with the laser based on a position of the alignment mark and a position of the cathode, to pattern the cathode material layer as a cathode pattern.

According to the embodiments of the present disclosure, each of the pixel units in the light-transmitting region of includes a cathode, orthographic projections of multiple cathodes onto the base substrate are separated from each other, and an orthographic projection of an effective light-emitting area of each sub-pixel onto the base substrate is within the orthographic projection of the cathode of a corresponding one of the pixel units onto the base substrate. The display panel further includes connection structures, the connection structures and the cathodes are arranged on a same layer, and different cathodes are connected through the connection structures. In this way, the embodiments of the present disclosure increase the opening area of a cathode layer in the light-transmitting region, which facilitates to improve the transparency of the light-transmitting region.

BRIEF DESCRIPTION OF THE DRAWINGS

In order to explain technical solutions of embodiments of the present disclosure more clearly, the following will briefly introduce the accompanying drawings used in the description of the embodiments of the present disclosure. Obviously, the accompanying drawings in the following description are only some embodiments of the present disclosure. Based on these drawings, those of ordinary skill in the art can obtain other drawings without creative effort.

DETAILED DESCRIPTION

The technical solutions in embodiments of the present disclosure will be clearly and completely described below in conjunction with the accompanying drawings in the embodiments of the present disclosure. Obviously, the described embodiments are a part of the embodiments of the present disclosure, but not all of the embodiments. Based on the embodiments in the present disclosure, all other embodiments obtained by those of ordinary skill in the art without creative effort shall fall within the protection scope of the present disclosure.

The present disclosure provides a display panel.

Figure 1:
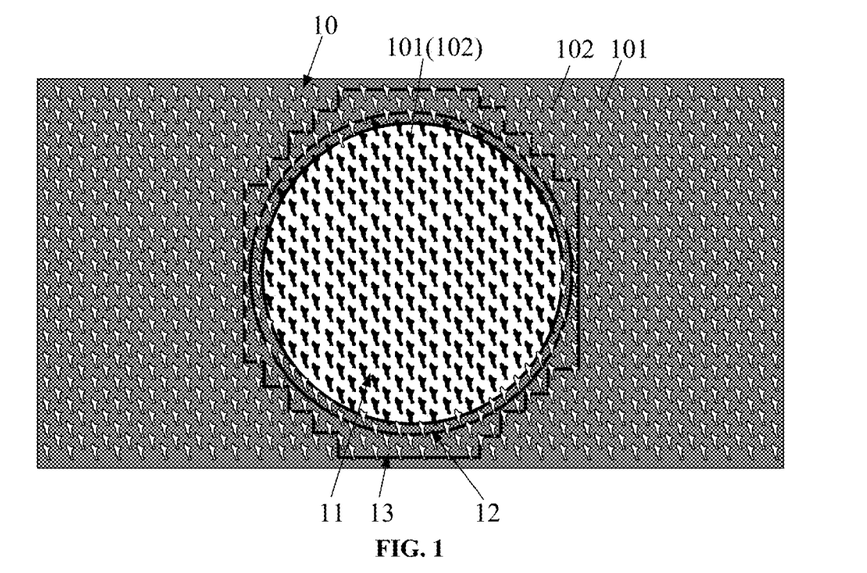
FIG. 1 is a schematic structural diagram of a display substrate according to an embodiment of the present disclosure.
Figure 2:
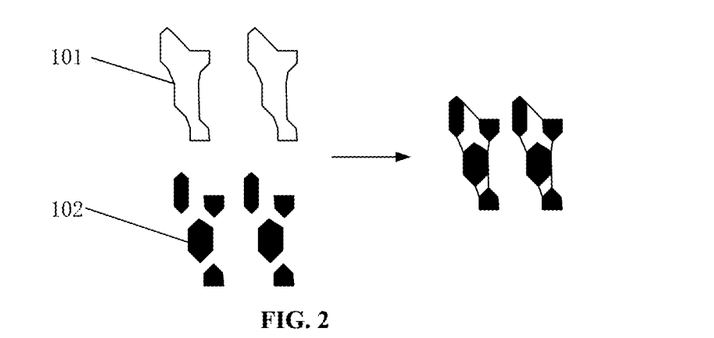
FIG. 2 is a schematic diagram of an anode and a cathode that are stacked according to an embodiment of the present disclosure.
Figure 3:
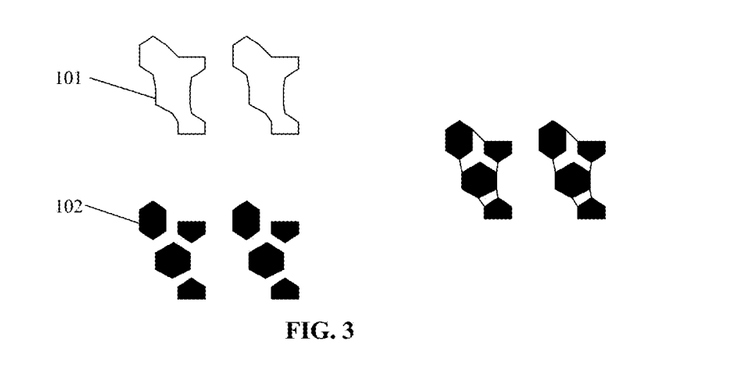
FIG. 3 is a schematic diagram of an anode and a cathode that are stacked according to another embodiment of the present disclosure.
Figure 4:
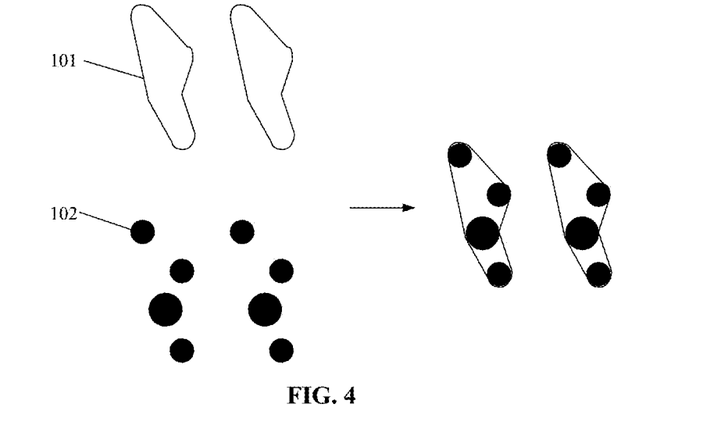
FIG. 4 is a schematic diagram of an anode and a cathode that are stacked according to another embodiment of the present disclosure.
Figure 5:
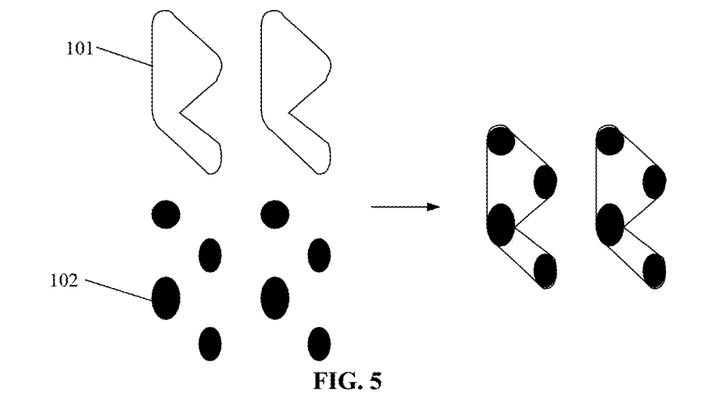
FIG. 5 is a schematic diagram of an anode and a cathode that are stacked according to another embodiment of the present disclosure.
Figure 6:
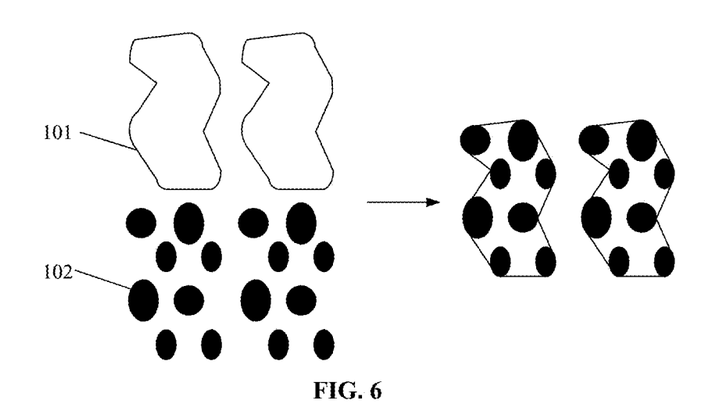
FIG. 6 is a schematic diagram of an anode and a cathode that are stacked according to another embodiment of the present disclosure.
Figure 7:
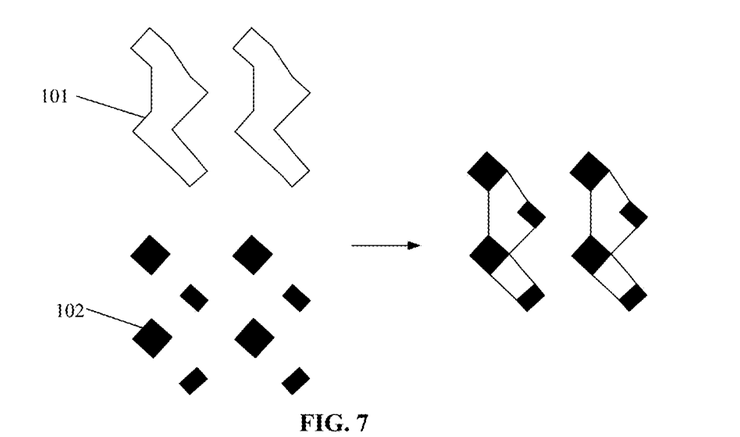
FIG. 7 is a schematic diagram of an anode and a cathode that are stacked according to another embodiment of the present disclosure.
Figure 8:
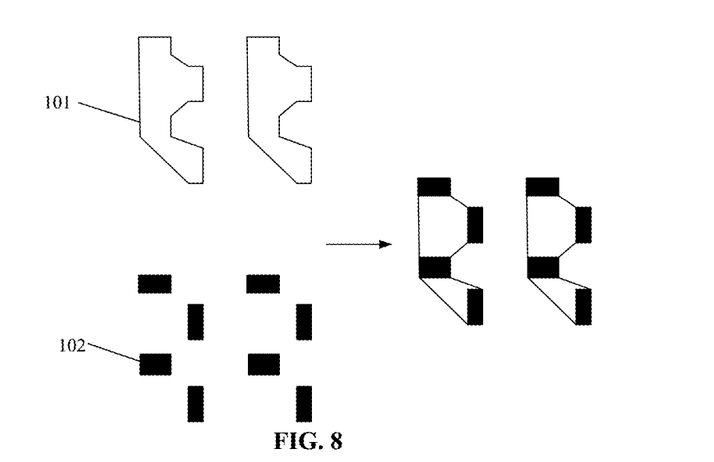
FIG. 8 is a schematic diagram of an anode and a cathode that are stacked according to another embodiment of the present disclosure.
Figure 9:
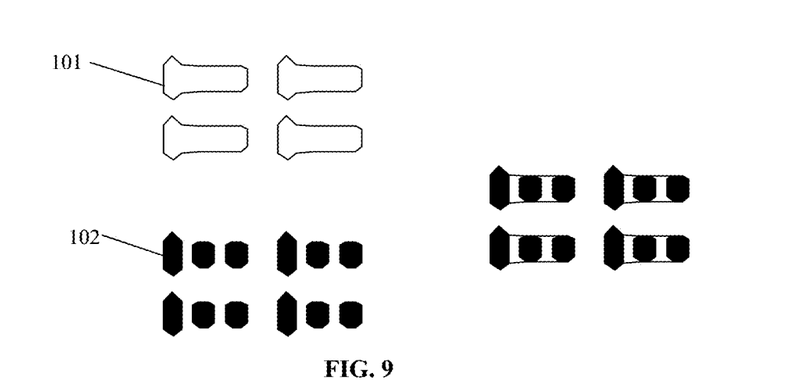
FIG. 9 is a schematic diagram of an anode and a cathode that are stacked according to another embodiment of the present disclosure.

As shown in FIG. 1, in an embodiment, the display panel includes a base substrate, and the base substrate includes a display area 10. In some embodiments, the display area 10 includes a plurality of pixel units. For a specific structure of the display area 10, the setting of the display area 10 of the display panel in the related art can be referred to, which will not be repeated herein.

The substrate further includes a functional area, and the functional area includes a light-transmitting region 11, which has a higher transparency than the display area 10, so as to facilitate other components to be arranged corresponding to the light-transmitting region 11.

Exemplarily, the light-transmitting region 11 may be provided with an under-screen camera. Correspondingly, in an embodiment, the light-transmitting region 11 is set to be circular or substantially circular to adapt to a shape of the camera. Since the light-transmitting region 11 has a higher transparency, it helps to improve the imaging effect. Obviously, the application range of the light-transmitting region 11 is not limited to this, for example, the light-transmitting region 11 may also be applied to a transparent display device, etc., which is not further limited herein.

The light-transmitting region 11 includes a plurality of pixel units, which is capable of emitting white light. Each of the pixel units includes at least one sub-pixel. Referring to FIG. 1 again, each of the pixel units also includes a cathode 101, and orthographic projections of multiple cathodes 101 onto the base substrate are separated from each other.

Figure 10:
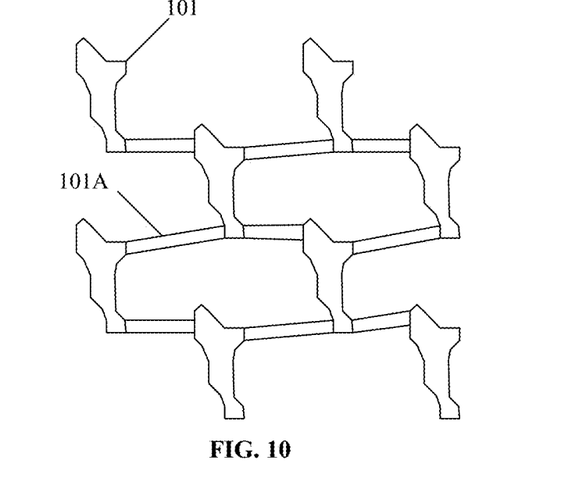
FIG. 10 is a schematic diagram shows connection between cathode and connection structures according to an embodiment of the present disclosure.

An orthographic projection of an effective light-emitting area of each sub-pixel onto the base substrate is within a range of the orthographic projection of the cathode 101 of the corresponding pixel unit onto the base substrate. As shown in FIG. 10, the display panel further includes connection structures 101A, and the connection structures 101A are arranged on a same layer as the cathodes 101, and different cathodes 101 are coupled to each other through the connection structure 101A.

A light-emitting unit of each sub-pixel includes a cathode 101, a light-emitting layer, and an anode 102, which are stacked in sequence. More specifically, in a direction from the anode 102 to the cathode 101, a hole injection layer, a hole transport layer, a light-emitting layer, an electron transport layer and an electron injection layer may be stacked in sequence between the anode 102 and the cathode 101. In some embodiments, an electron blocking layer may be further provided between the hole transport layer and the light-emitting layer, and a hole blocking layer may be further provided between the light-emitting layer and the electron transport layer. It should be appreciated that under normal circumstances, in order to ensure the display effect, the injected electrons are excessive. Generally speaking, the electron blocking layer needs to be provided, while the hole blocking layer may be omitted.

It should be understood that the cathode 101 of the light-emitting unit is usually a structure of a whole surface. Please refer to FIG. 1, for example, in the display area 10, the anode 102 of the light-emitting unit is patterned, and the cathode 101 of the light-emitting unit has an entire surface structure. In other words, in the display area 10, the cathode 101 is not patterned. The cathode 101 not only covers the anode 102, but also covers the area outside the anode 102. The cathode 101 of the whole surface has a certain shielding effect on light, which affects the light transmittance of the structure.

In this embodiment, in the light-transmitting region 11, the cathode layer includes multiple independent cathodes 101 obtained by patterning. Referring to FIG. 1 again, in the light-transmitting region 11, patterns filled with black represent a stacked structure of the cathodes 101 and the anodes 102, that is, the cathodes 101 cover areas where the anodes 102 are located, and other cathode materials in the cathode layer are removed to a certain extent to reduce the light shielding extent and improve the transparency of the light-transmitting region 11. As shown in FIG. 10, the cathodes 101 are electrically connected through the connection structures 101A, so as to provide a same common voltage to form a common electrode.

In this way, in the embodiments of the present disclosure, the orthographic projection of the effective light-emitting area of each sub-pixel in the light-transmitting region 11 onto the base substrate is controlled to be located within the range of the orthographic projection of the cathode 101 of the corresponding pixel unit onto the base substrate, which avoids adversely affecting the normal operation of the light-emitting unit. Meanwhile, the cathode layer is composed of multiple cathodes 101, and the cathode material does not exist in other areas, which increases the opening area of the cathode layer in the light-transmitting region 11, and helps to improve the transparency of the light-transmitting region 11.

In some embodiments, an orthographic projection of an edge of the cathode 101 onto the base substrate is separated from the orthographic projection of the effective light-emitting area of the corresponding sub-pixel onto the base substrate. The orthographic projection of the edge of the cathode 101 onto the base substrate overlaps the orthographic projection of the anode 102 of the corresponding sub-pixel onto the base substrate, which avoids occupying more space. In this way, under the condition of ensuring the display effect, it is helpful to increase the opening area of the cathode 101 and increase the light transmittance.

In some embodiments, the orthographic projection of the anode 102 of multiple sub-pixels included in each pixel unit onto the base substrate is within the orthographic projection of the cathode 101 of the pixel unit onto the base substrate, which may be understood as: the multiple sub-pixels of each pixel unit are arranged corresponding to a same cathode 101, and positions of the multiple sub-pixels of the same pixel unit are relatively close to each other, which facilitates to increase the opening area of the cathode 101 and improve the light transmittance.

As shown in FIG. 2 to FIG. 9, in an embodiment, the sub-pixels of each pixel may be arranged in different ways, and correspondingly, the anodes 102 of the sub-pixels are arranged in different ways. For different arrangements, the cathode 101 of the sub-pixels of each pixel unit corresponds to the effective light-emitting area of this pixel unit, which improves the applicability to different types of display substrates.

In some embodiments, an orthographic projection of an edge of the anode 102 onto the base substrate overlaps the orthographic projection of the edge of the corresponding cathode 101 onto the base substrate.

It may be appreciated that, viewed along a direction perpendicular to the substrate, a part of the edge of the cathode 101 of a pixel unit overlaps with a part of the edge of the anode 102 of the sub-pixels included in the pixel unit. In this way, the orthographic projection of the anode 102 onto the base substrate is within the range of the orthographic projection of the cathode 101 onto the base substrate, thus the electron injection effect can be ensured without adversely affecting the display effect. Meanwhile, by controlling the edge of the anode 102 and the edge of the cathode to overlap, the area of the cathode 101 can be reduced as much as possible, and it is conductive to increase the area of the opening area corresponding to the cathodes 101, thereby increasing the light transmittance.

In some embodiments, in an area outside the area where the orthographic projection of the anode 102 onto the base substrate overlaps the orthographic projection of the corresponding cathode 101 onto the base substrate, the orthographic projection of the edge of the cathode 101 onto the base substrate extends along a straight line.

It can be appreciated that a part of the edge of the cathode 101 extends along the edge of the anode 102, and the other part of the edge of the cathode 101 extends along a straight line, so as to reduce the area of the cathode 101 and increase the light transmittance of the display substrate.

In some embodiments, a chamfering process is performed all the edges of the cathode 101, and each edge chamfer of the cathode 101 is larger than 30 degrees.

As shown in FIG. 2, FIG. 3, FIG. 7 and FIG. 8, there may be sharp corners at some positions of the anode 102, and if the cathode 101 extends completely along the edge of the anode 102 in these areas, the sharp corner structure will also be formed for the cathode 101. Furthermore, at a position where the edge of the cathode 101 is separated from the edge of the anode 102, the cathode 101 may also have a sharp corner.

In the process of implementing the technical solutions of the present disclosure, the relevant technical personnel discovered that the sharp-angled structure may aggravate the diffraction of light and affect the display effect and the imaging effect of a camera under a screen. Therefore, in the embodiments, all the edges of the cathode 101 are chamfered, to reduce the possibility of light diffraction. In some embodiments, each of the edge chamfers of the cathode 101 is greater than 30 degrees, which can reduce the possibility of the light diffraction phenomenon.

As shown in FIG. 10, in some embodiments, the plurality of cathodes 101 and the connection structures 101A in the light-transmitting region 11 constitute a mesh structure. The mesh structure includes a plurality of openings, and each of the openings is surrounded by the cathode 101 and the connection structure 101A, which can increase the opening area of the light-transmitting region 11, thereby increasing the light transmittance of the light-transmitting region 11. In some embodiments, materials of the cathode 101 and the connection structure 101A are the same, light-transmitting region light-transmitting region, which is conductive to reduce a contact resistance between the cathode 101 and the connection structure 101A, thereby improving the luminous efficiency.

Figure 11:
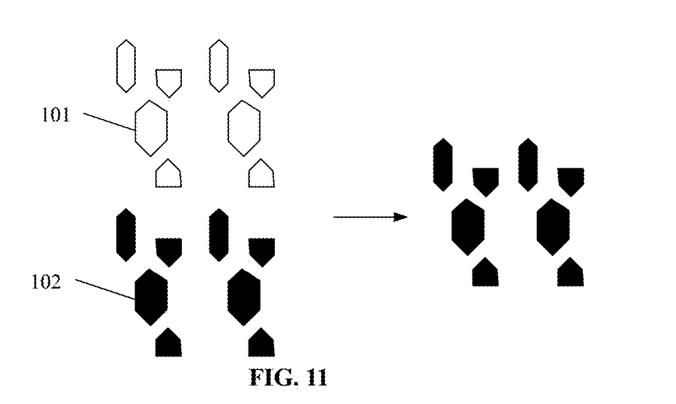
FIG. 11 is a schematic diagram of an anode and a cathode that are stacked according to another embodiment of the present disclosure.

As shown in FIG. 11, in some embodiments, the orthographic projection of the cathode 101 onto the base substrate and the orthographic projection of the anode 102 onto the base substrate completely overlap, and correspondingly, the edges of the cathode 101 completely overlap the edges of the anode 102. The number and positions of the cathodes 101 are in one-to-one correspondence with the number and the positons of the anodes 102, and their shapes and sizes are also the same. In this way, the opening area corresponding to the cathode 101 can be maximized, and the light transmittance of the display substrate can be improved.

Figure 12:
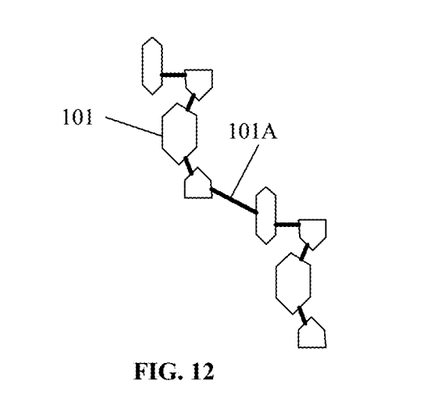
FIG. 12 is a schematic diagram shows connection between cathode and connection structures according to an embodiment shown in FIG. 11.

As shown in FIG. 12, the cathodes 101 corresponding to the anodes 102 may also be connected through the connection structures 101A to provide a common voltage.

As shown in FIG. 1, in some embodiments, a plurality of cathodes 101 are arranged in a first direction to form a plurality of rows of cathodes 101, and the plurality of rows of cathodes 101 are arranged in a second direction. In an embodiment, one of the first direction and the second direction may be an extension direction of scan lines in a display panel, and the other one may be an extension direction of data lines in the display panel. Illustratively, in an embodiment, the first direction is the horizontal direction shown in FIG. 1, and the second direction is the vertical direction shown in FIG. 1. An angle between the first direction and the second direction ranges from 80 to 100 degrees. Two adjacent rows of cathodes 101 are arranged in a staggered manner in the first direction, which may be understood as positions of two adjacent rows of cathodes 101 in the second direction are not aligned. It is helpful to increase the number of cathodes 101 per unit area and increase the space utilization rate, and thereby increasing the resolution of the display panel.

As shown in FIG. 1, in some embodiments, the functional area further includes a transition region 12 and a pixel circuit region 13. The pixel circuit region 13 is arranged around the light-transmitting region 11, and the transition region 12 is arranged between the pixel circuit region 13 and the light-transmitting region 11. The transition region 12 and the pixel circuit region 13 share a cathode 101. An orthographic projection of the cathodes 101 onto the base substrate in the transition region 12 and the pixel circuit region 13 is a solid pattern, and the solid pattern refers to an overall structure that is not patterned.

As shown in FIG. 1, in an embodiment, the transition region 12 is approximately ring-shaped and surrounds the light-transmitting region 11, and an inner contour of the pixel circuit region 13 is a circle, and an outer contour of the pixel circuit region 13 is an irregular pattern. The pixel circuit region 13 surrounds the transition region 12. It should be understood that the edges of the transition region 12 and the pixel circuit region 13 in this embodiment are only used to exemplify the approximate boundary positions between the areas, and are not actual boundary structures.

Figure 13:
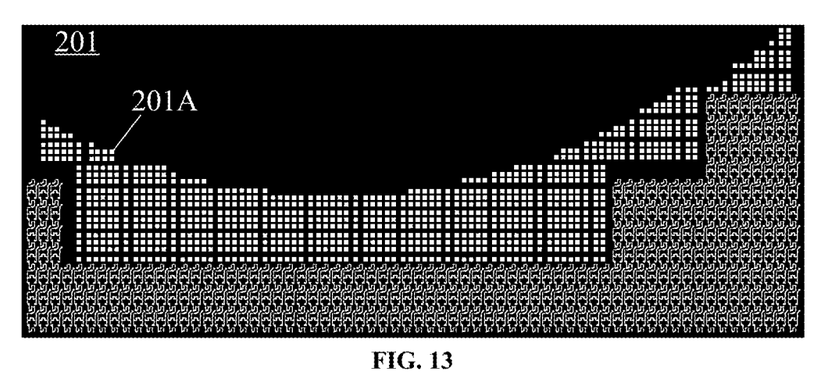
FIG. 13 is a schematic structural diagram of a semiconductor layer according to an embodiment of the present disclosure.

Referring to both FIG. 1 and FIG. 13, in some embodiments, the display substrate further includes a semiconductor layer 201, and in the transition region 12, the semiconductor layer 201 includes a plurality of dummy patterns 201A (dummy), where the dummy patterns 201A are arranged at intervals and in an array. In the embodiments, a plurality of dummy patterns 201A are further provided, and the dummy patterns 201A are used to assist positioning, so as to assist in improving the accuracy of the exposure position of traces.

Figure 14:
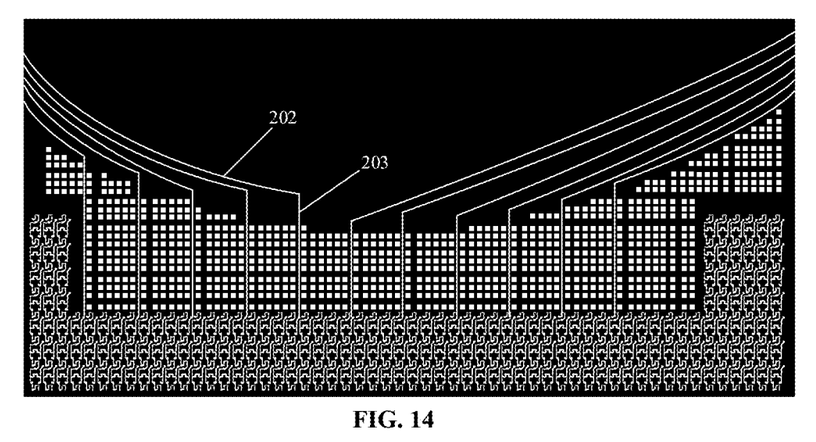
FIG. 14 is a schematic diagram shows a stack of a semiconductor layer and a first gate layer according to an embodiment of the present disclosure.

Please refer to FIG. 1 and FIG. 14 at the same time. In some embodiments, the display panel further includes a plurality of arc-shaped winding wires 202. The winding wires 202 extend along an edge of the light-transmitting region 11, and the winding wires 202 are coupled to pixel circuits located in the pixel circuit region 13 via traces or wires in the transition region 12.

It can be understood that no driving circuit is provided in the light-transmitting region 11 in the embodiments, all the driving circuits of the pixel units in the light-transmitting region 11 are arranged in the pixel circuit region 13, and the driving circuits in the pixel circuit region 13 are coupled to the light-emitting units located in the light-transmitting region 11 through the traces in the transition region 12, which is conductive to further improve the transparency of the light-transmitting region 11.

Figure 15:
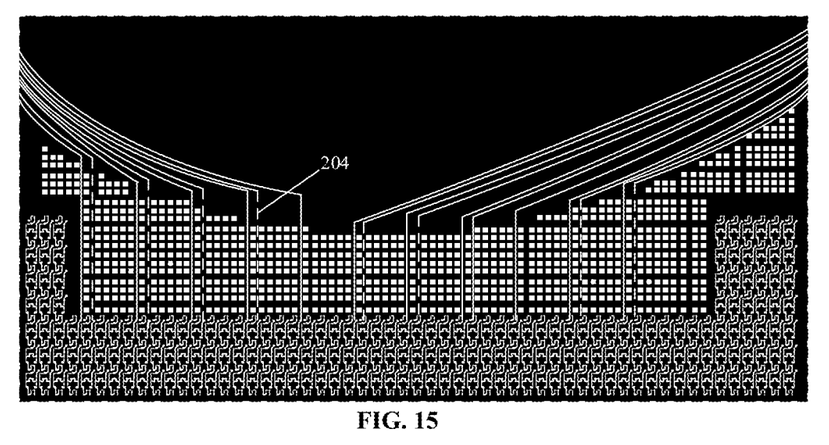
FIG. 15 is a schematic diagram shows a semiconductor layer, a first gate layer, and a second gate layer that are stacked according to an embodiment of the present disclosure.
Figure 16:
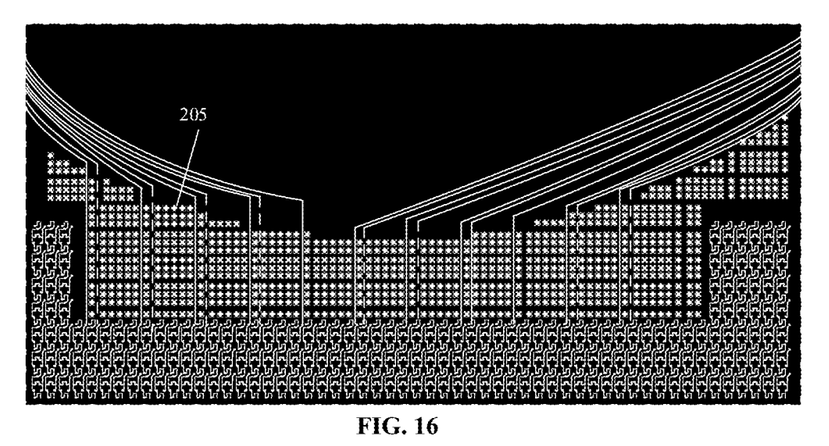
FIG. 16 is a schematic diagram shows a stack of a semiconductor layer, a first gate layer, and a second gate layer according to an embodiment of the present disclosure.

As shown in FIG. 14 and FIG. 15, the above-mentioned traces include a first transfer wire 203 and a second transfer wire 204.

As shown in FIG. 14, in some embodiments, the display substrate further includes a first gate layer located between the semiconductor layer 201 and the anode layer, and the first gate layer includes a plurality of first transfer wires 203 located in the transition region 12. The size of the first transfer wire 203 in the second direction is larger than the size of the first transfer wire 203 in the first direction. The first transfer wires 203 are arranged in the first direction and are parallel to each other. Orthographic projections of the first transfer wires 203 onto the base substrate are separated from orthographic projections of the dummy patterns 201 onto the base substrate.

As shown in FIG. 14, it can be understood that the first transfer wire 203 is located between two adjacent columns of dummy patterns 201 along the second direction, which helps to improve the uniformity of thicknesses of a structure at different positions of the display panel.

As shown in FIG. 15, in some embodiments, the display panel further includes a second gate layer located between the first gate layer and the anode layer, and the second gate layer includes a plurality of second transfer wires 204 located in the transition region 12. The second transfer wire 204 extends in the second direction, and orthographic projections of the second transfer wires 204 onto the base substrate are separated from both the orthographic projections of the dummy patterns 201 onto the base substrate, and the orthographic projections of the first transfer wires 203 onto the base substrate.

As shown in FIG. 15, similar to the arrangement of the first transfer wire 203, the second transfer wire 204 in the embodiments is also arranged between two adjacent columns of dummy patterns 201 along the second direction, and the first transfer wire 203 and the second transfer wire 204 are located between different columns of dummy patterns 201, which helps to improve the uniformity of the thicknesses of different regions of the display panel. A ratio of a distance between two adjacent first transfer wires 203 to a distance between two adjacent second transfer wires 204 ranges from 0.8 to 1.2, which helps to further improve the uniformity of the thickness of different regions of the display substrate.

It should be understood that the dotted line in FIG. 15 only indicates the position of the second transfer wire 204, but does not represent the actual structure of the second transfer wire 204.

The above-mentioned first transfer wire 203 and second transfer wire 204 are mainly used to realize the electrical connection of the pixel circuits. It should be understood that due to the existence of the light-transmitting region 11, the pixel circuits are separated from each other in the second direction. As shown in FIG. 14 and FIG. 15, one end of each of the first transfer wire 203 and the second transfer wire 204 is coupled to the winding wire 202, and the other end is coupled to the pixel circuit. In the other side of the light-transmitting region 11 along the second direction, the first transfer wires 203 and the second transfer wires 204 are also arranged, to be electrically coupled to the corresponding winding wires 202, so as to achieve the electrical connection among the pixel circuits located on the opposite sides of the light-transmitting region 11. Meanwhile, it is avoided to arrange traces in the light-transmitting region 11, which helps to further improve the transparency of the light-transmitting region 11.

In some embodiments, the display panel further includes an intermediate insulation layer located between the second gate layer and the anode layer 102. In the transition region 12, the intermediate insulation layer includes a plurality of via holes 205. An orthographic projection of each via hole 205 onto the base substrate overlaps the orthographic projection of a dummy pattern 201 onto the base substrate. By controlling the position of the via hole 205 of the intermediate insulation layer to overlap the orthogonal projection of the dummy pattern 201, it is helpful to improve the uniformity of the thickness of the display panel.

Figure 17:
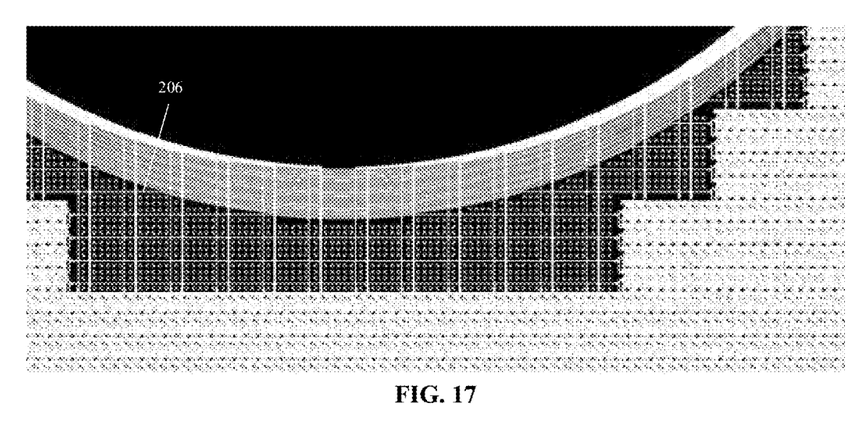
FIG. 17 is a schematic diagram shows a stack of a semiconductor layer, a first gate layer, a second gate layer, and a first metal layer according to an embodiment of the present disclosure.

As shown in FIG. 17, in some embodiments, the display panel further includes a first metal layer located between the intermediate insulation layer and the anode layer 102. In the transition region 12, the first metal layer includes a plurality of third transfer wires 206, and the size of the third transfer wire 206 in the first direction is larger than the size of the third transfer wire 206 in the second direction. An angle between an orthographic projection of the third transfer wire 206 onto the base substrate and the orthographic projection of the first transfer wire 206 onto the base substrate is 80 to 100 degrees, and the orthographic projection of the third transfer wire 206 onto the base substrate is separated from the orthographic projection of the dummy pattern 201 onto the base substrate. Similar to the functions of the first transfer wire 203 and the second transfer wire 204, the third transfer wire 206 is used to realize the connection of the pixel circuits in the first direction.

In the embodiments, similar to the arrangement of the first transfer wire 203 and the second transfer wire 204, the third transfer wire 206 in the embodiments is located between two adjacent rows of dummy patterns 201 along the first direction, which helps to improve the uniformity of thickness of the display panel.

Figure 18:
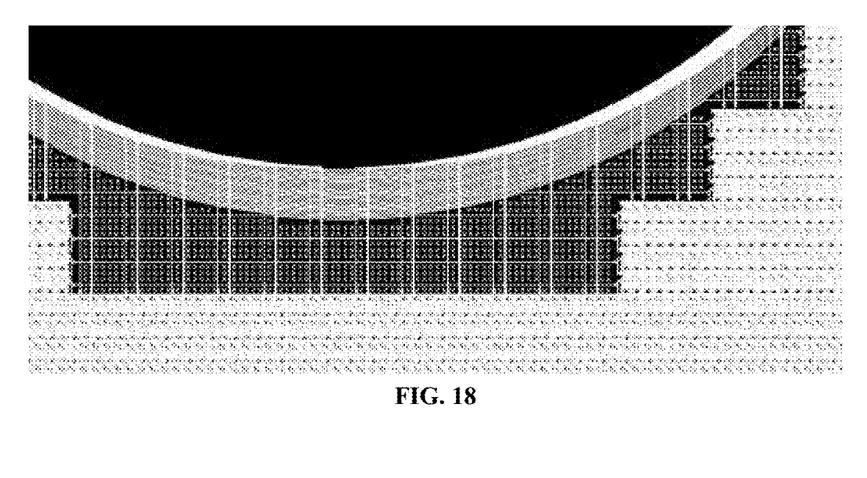
FIG. 18 is a schematic diagram shows a stack of a semiconductor layer, a first gate layer, a second gate layer, a first metal layer, and a first planarization layer according to an embodiment of the present disclosure.

As shown in FIG. 18, on a side of the first metal layer away from the substrate, a first planarization layer (not marked) can be provided as required.

Figure 19:
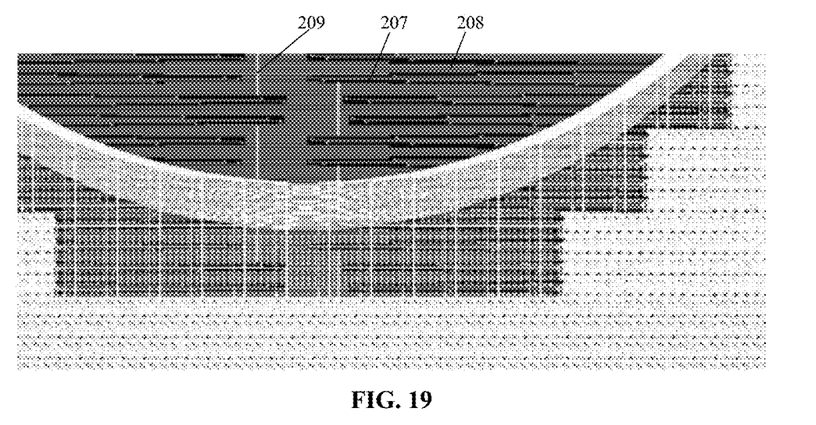
FIG. 19 is a schematic diagram shows a stack of a semiconductor layer, a first gate layer, a second gate layer, a first metal layer, a first planarization layer and a transparent wire according to an embodiment of the present disclosure.

As shown in FIG. 19, in some embodiments, the display panel further includes a transparent wire layer located between the first metal layer and the anode 102. The transparent wire layer includes transparent wires 207 and first dummy wires 208 extending in the first direction, and the transparent wires 207 are separated from the first dummy wires 208. The transparent conductive layer further includes a plurality of second dummy wires 209 extending in the second direction.

As shown in FIG. 19, in some embodiments, each anode 102 is coupled to a transparent wire 207 through an anode hole, the transparent wire 207 is coupled to the pixel circuit provided in the pixel circuit region 13, and the first dummy wire 208 is coupled to the second dummy wire 209.

The first dummy wire 208 and the second dummy wire 209 in the embodiments are used to balance the thickness of different regions of the display panel, improve the uniformity of the thickness of different structures, and help improve the display effect.

Figure 20:
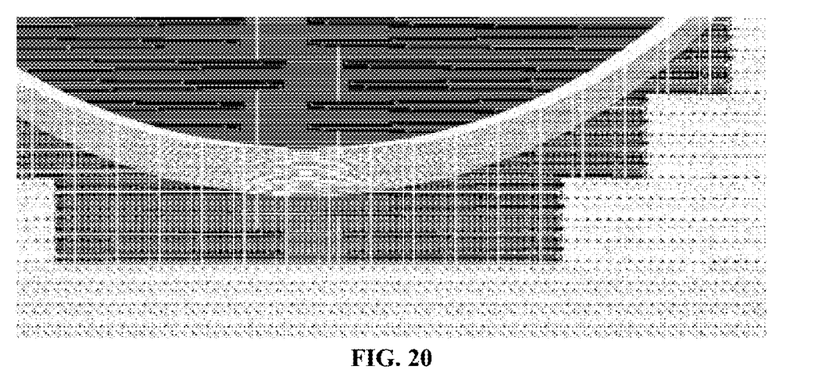
FIG. 20 is a schematic diagram shows a stack of a semiconductor layer, a first gate layer, a second gate layer, a first metal layer, a first planarization layer, a transparent wire, and a second planarization layer according to an embodiment of the present disclosure.

As shown in FIG. 20, the display substrate further includes a second planarization layer (not marked), which is used to improve the flatness of the anode 102 that is fabricated subsequently.

Figure 21:
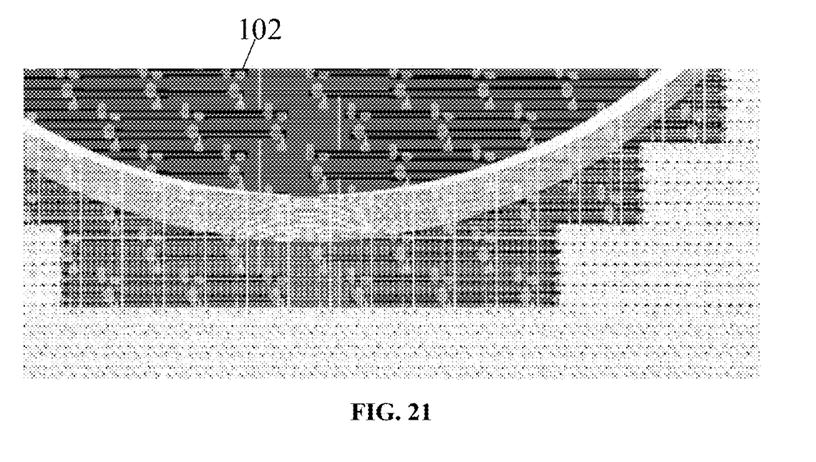
FIG. 21 is a schematic diagram shows a stack of a semiconductor layer, a first gate layer, a second gate layer, a first metal layer, a first planarization layer, a transparent wire, a second planarization layer, and an anode according to an embodiment of the present disclosure.

As shown in FIG. 21, the anode 102 is arranged on a side of the second planarization layer away from the substrate, and the anode 102 is coupled to a transparent wire 207 through the anode hole.

Figure 22:
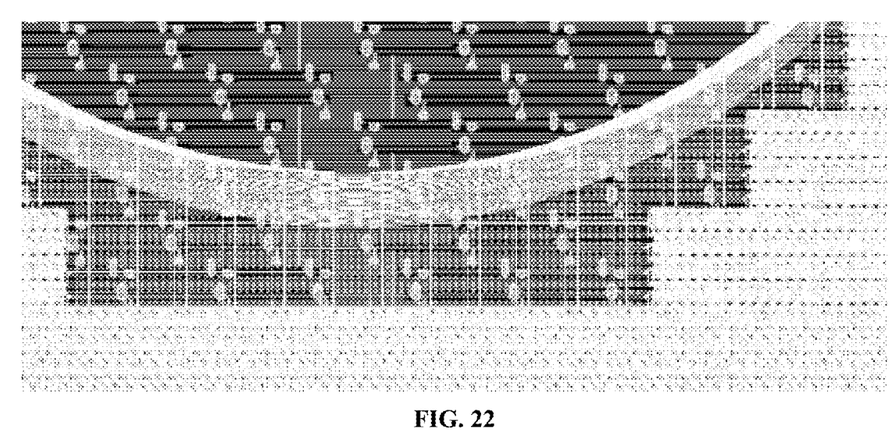
FIG. 22 is a schematic diagram shows a semiconductor layer, a first gate layer, a second gate layer, a first metal layer, a first planarization layer, a transparent wire, a second planarization layer, an anode and a pixel defining layer that are stacked according to an embodiment of the present disclosure.

As shown in FIG. 22, a pixel defining layer (not shown) is also provided on a side of the anode away from the substrate, to define a range of the effective light-emitting area of each pixel.

Figure 23:
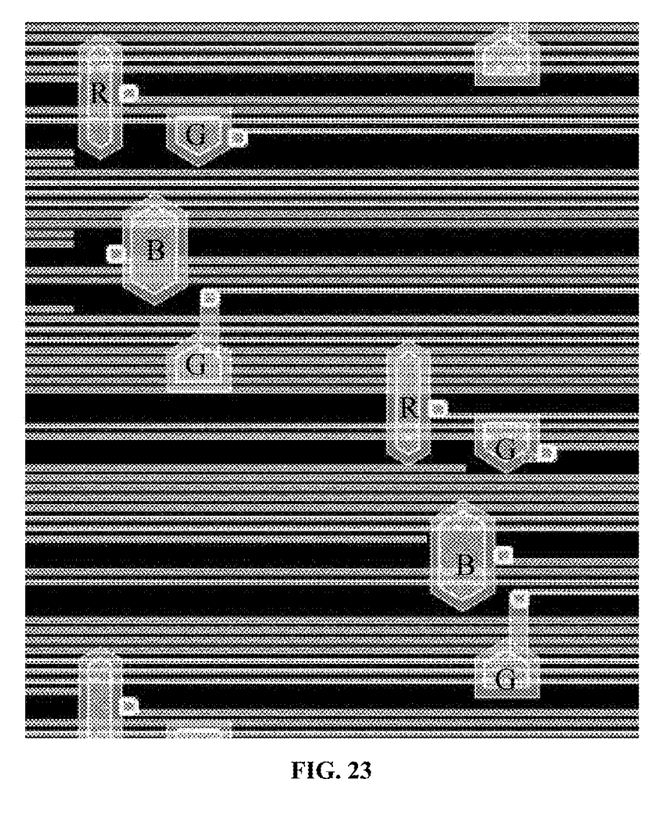
FIG. 23 is a schematic diagram of a pixel structure in a light-transmitting region according to an embodiment of the present disclosure.

As shown in FIG. 23, in some embodiments, each pixel unit includes a plurality of sub-pixels, and orthographic projections of the anodes of the plurality of sub-pixels onto the base substrate are separated from each other. Illustratively, the sub-pixels corresponding to each pixel unit include two green sub-pixels G, one red sub-pixel R and one blue sub-pixel B. The two green sub-pixels G are arranged along the second direction, and an effective light-emitting area of the blue sub-pixel B is located between effective light-emitting areas of the two green sub-pixels G in the second direction.

The pixel unit in an embodiment includes four sub-pixels, which may be RGGB (red, green, green, and blue) sub-pixels, for example. There is an overlap area between the edge of the anode 102 and the edge of the cathode 101 of the four sub-pixels.

In some embodiments, center lines of effective light-emitting areas of the two green sub-pixels G substantially overlap along the second direction, and effective light-emitting areas of the blue sub-pixel B and the red sub-pixel R are located on a same side of the center line.

In the second direction, distances from the effective light-emitting area of the blue sub-pixel B to the effective light-emitting area of the two green sub-pixels G are approximately the same distance. In the first direction, the effective light-emitting area of the red sub-pixel R does not overlap the effective light-emitting area of the blue sub-pixel B, and overlaps the effective light-emitting area of one of the green sub-pixels G in the first direction.

In the second direction, the effective light-emitting area of the red sub-pixel R is located on a side of the effective light-emitting area of the blue sub-pixel B away from the green sub-pixels G, anode holes of some blue sub-pixels B are located on one side of the effective light-emitting area of the blue sub-pixel B in the second direction, and anode holes of some other blue sub-pixels B are located on the other side of the effective light-emitting area of the blue sub-pixel B.

As shown in FIG. 24, for a pixel unit in the upper left corner, the anode hole of the blue sub-pixel B is located on the left, and for a pixel unit in the lower right corner, the anode hole of the blue sub-pixel B is located on the right.

An embodiment of the present disclosure provides a method for manufacturing a display panel, which is used to manufacture the display panel described in any one of the above embodiments. The method includes a step of forming a cathode 101, and the step of forming a cathode 101 includes:

forming a cathode material layer;

burning the cathode material layer with a laser to pattern the cathode material layer; and removing residual particles from the cathode material layer by using a plasma air knife.

In an embodiment, the cathode material layer is patterned by laser etching to form the cathode layer, and a plasma air knife is further used to remove residual particles to ensure the quality of the formed cathode pattern.

In some embodiments, a shape of an orthographic projection of the cathode 101 onto the base substrate is an asymmetrical pattern.

In the process of implementing the technical solutions of the present disclosure, the relevant technical personnel of the present disclosure have discovered that the patterning of the cathode 101 can be realized by pre-shielding by an Open mask (open mask) or a FMM mask (fine metal mask). However, due to the limitation of a mesh as used, the formed pattern of the cathode 101 must have a symmetrical structure, resulting in a decrease in aperture ratio. Related processes require the use of special cathode materials, which results in a low single-layer transmittance, and aggravates the light diffraction.

In an embodiment, the cathode 101 is obtained through patterning by laser etching, and the obtained cathode 101 has an asymmetric structure. Compared with the symmetric cathode 101, the asymmetric structure helps reduce light diffraction and helps increase the opening rate, that is, increase the transmittance of light. In addition, the use of laser etching for patterning can be achieved on the basis of conventional materials of the cathode 101. For example, conventional materials of the cathode 101 such as MgAg (magnesium silver alloy) may be selected, which also helps to control the cost.

It should be understood that laser ablation and etching may generate a lot of heat. During implementation, a pixel defining layer may be used as a buffer to reduce the possible influence caused by heat generated during the etching process.

In some embodiments, the step of the burning the cathode material layer with the laser to pattern the cathode material layer includes:

setting the display substrate including the cathode material layer on a processing platform of a laser etching device;

capturing an alignment mark on the display substrate by using the laser etching device; and burning the cathode material layer with the laser based on a position of the alignment mark and a position of the cathode, to pattern the cathode material layer as a cathode pattern.

In the embodiments, in the process of patterning the cathode material layer to form the cathode, the laser etching device is first used to capture the alignment mark, and then according to a relative position of the alignment mark and the cathode in the preset drawing, any materials of the cathode material layer except the cathode is burned, and the remaining cathode material layer forms a patterned cathode pattern at the designated position.

Assuming that an aperture ratio of an opening area of the other structure is m, an aperture ratio of an opening area corresponding to the cathode 101 is n, the opening area corresponding to the cathode 101 is within a range of the opening area of the other structure, a light transmittance of the cathode 101 is x, and a light transmittance of the display substrate without a light-blocking layer is C.

When the cathode 101 is not patterned, the light transmittance is Tr.1=C*[m*x]; when the cathode 101 is patterned, the light transmittance Tr.2=C*[(m−n)*x+n*1], $$\frac{Tr.2}{Tr.1} = 1 + \frac{(1-x)n}{mx}$$

where Tr.1 and Tr.2 are the corresponding light transmittances. Furthermore, may be obtained.

In an embodiment, exemplarily, an example that m=92.35%, n=86.78%, and x=55% is given, and after calculation, $$\frac{Tr.2}{Tr.1}$$

is approximately equal to 1.77. It can be seen that the light transmission of the display substrate is increased significantly.

In some embodiments, the connection structure 101A may be arranged in a same layer and made of a same material as the cathode 101. Specifically, it may be formed at the same time when a material layer of the cathode 101 is patterned to obtain the cathode 101, that is, the cathode 101 and the connection structure 101A are manufactured through a single patterning process, which helps to save production cost and production process.

In the process of implementing the technical solutions of the present disclosure, the technical personnel found that due to factors such as processing technology, a width of the connection structure 101A arranged in the same layer and made of the same material as the cathode 101 needs to be larger than 5 microns. After further research, it is found that this solution may cause the light transmittance of the display substrate to be decreased, and cause diffraction of the light to be increased, which affects the display effect and the imaging effect of a camera under a screen.

In some other embodiments, the cathodes 101 are electrically connected through the connection structures 101A, and the connection structure 101A and the cathode 101 are respectively formed by different patterning processes.

In the embodiments, the connection structure 101A between the cathodes 101 is a transparent and conductive connection structure 101A, and the transparent and conductive connection structure 101A is separately formed. That is to say, in the embodiments, a patterning process is required to form independent and insulated cathodes 101, and another patterning process is required to form the transparent and conductive connection structure 101A for connecting the cathodes 101.

A material of the transparent and conductive connection structure 101A may be selected from ITO (Indium Tin Oxide) and other materials with high transparency. The electrical connection between the cathodes 101 can be achieved through the transparent and conductive connection structures 101A, which can further improve the light transmittance of the display substrate.

The present disclosure further provides a display device.

In an embodiment, the display device includes the display panel according to any one of the above display panel embodiments, and a camera is arranged in the light-transmitting region 11.

Since the display device of these embodiments includes all the technical solutions of the above-mentioned display panel embodiments, it can at least achieve all the above-mentioned technical effects, which will not be repeated herein.

The above embodiments are only specific implementations of the present disclosure, but the protection scope of the present disclosure is not limited thereto. Any person skilled in the art can easily think of changes or substitutions within the technical scope disclosed in the present disclosure, all of which shall fall within the protection scope of the present disclosure. Therefore, the protection scope of the present disclosure should be subjected to the protection scope of the claims.

What is claimed is:

1. A display panel, comprising a base substrate, wherein the base substrate comprises a display area and a functional area, the functional area comprises a light-transmitting region, the light-transmitting region comprises a plurality of pixel units, and the plurality of pixel units is capable of emitting white light;

each of the pixel units comprises at least one sub-pixel, each of the pixel units further comprises a cathode, orthographic projections of a plurality of cathodes onto the base substrate are separated from each other, and an orthographic projection of an effective light-emitting area of each of the sub-pixels onto the base substrate is within the orthographic projection of the cathode of a corresponding one of the pixel units onto the base substrate; and the display panel further comprises connection structures, the connection structures and the cathodes are arranged on a same layer, and different cathodes are connected via the connection structures;

wherein the plurality of cathodes and the connection structures in the light-transmitting region form a mesh structure, the mesh structure comprises a plurality of openings, each of the openings is surrounded by the cathodes and the connection structures, and the cathodes and the connection structures are made of a same material;

wherein the plurality of cathodes are arranged in a first direction to form a plurality of rows of cathodes, the plurality of rows of cathodes are arranged in a second direction, an angle between the first direction and the second direction ranges from 80 to 100 degrees, and two adjacent rows of cathodes are staggered in the first direction;

wherein the functional area further comprises a transition region and a pixel circuit region, the pixel circuit region is around the light-transmitting region, and the transition region is arranged between the pixel circuit region and the light-transmitting region; and the transition region and the pixel circuit region share a cathode, and an orthographic projection of the cathodes onto the base substrate in the transition region and the pixel circuit region is a solid pattern;

wherein the display panel further comprises a plurality of arc-shaped winding wires, the winding wires extend along an edge of the light-transmitting region, and the winding wires are coupled to pixel circuits located in the pixel circuit region via wires in the transition region.

2. The display panel according to claim 1, wherein an orthographic projection of an edge of the cathode onto the base substrate is separated from the orthographic projection of the effective light-emitting area of a sub-pixel corresponding to the cathode onto the base substrate, and the orthographic projection of the edge of the cathode onto the base substrate overlaps an orthographic projection of an anode of the sub-pixel corresponding to the cathode onto the base substrate.

3. The display panel according to claim 1, wherein an orthographic projection of an anode of the at least one sub-pixel comprised in each of the pixel units onto the base substrate is located within the orthographic projection of the cathode of the pixel unit onto the base substrate.

4. The display panel according to claim 3, wherein an orthographic projection of an edge of the anode onto the base substrate partially overlaps the orthographic projection of the edge of the corresponding cathode onto the base substrate.

5. The display panel according to claim 4, wherein, in an area outside an area where the orthographic projection of the anode onto the base substrate overlaps the orthographic projection of the corresponding cathode onto the base substrate, the orthographic projection of the edge of the cathode onto the base substrate extends along a straight line.

6. The display panel according to claim 5, wherein a chamfering process is performed on each edge of the cathode, and each edge chamfer of the cathode is larger than 30 degrees.

7. The display panel according to claim 1, further comprising a semiconductor layer, wherein the semiconductor layer comprises a plurality of dummy patterns in the transition region, and the dummy patterns are arranged at intervals and in an array.

8. The display panel according to claim 7, further comprising a first gate layer between the semiconductor layer and an anode layer, wherein the first gate layer comprises a plurality of first transfer wires located in the transition region, and each of the first transfer wires has a size in the second direction greater than a size in the first direction;

the plurality of the first transfer wires is arranged in the first direction and parallel to each other, and orthographic projections of the first transfer wires onto the base substrate are separated from orthographic projections of the dummy patterns onto the base substrate.

9. The display panel according to claim 8, further comprising a second gate layer located between the first gate layer and the anode layer, wherein the second gate layer comprises a plurality of second transfer wires located in the transition layer, and each of the second transfer wires has a size in the second direction larger than a size in the first direction, and orthographic projections of the second transfer wires onto the base substrate are separated from both the orthographic projections of the dummy patterns onto the base substrate and the orthographic projections of the first transfer wires onto the base substrate; and a ratio of a distance between two adjacent first transfer wires to a distance between two adjacent second transfer wires ranges from 0.8 to 1.2.

10. The display panel according to claim 9, further comprising an intermediate insulation layer between the second gate layer and the anode layer, wherein in the transition region, the intermediate insulation layer comprises a plurality of via holes, and an orthographic projection of each of the via holes onto the base substrate overlaps an orthographic projection of one of the dummy patterns onto the base substrate.

11. The display panel according to claim 10, further comprising a first metal layer between the intermediate insulation layer and the anode layer, wherein in the transition region, the first metal layer comprises a plurality of third transfer wires, and a size of each of the third transfer wires in the first direction is larger than a size of the third transfer wire in the second direction; and an angle between an orthographic projection of the third transfer wire onto the base substrate and the orthographic projection of the first transfer wire onto the base substrate is within a range of 80 to 100 degrees, and the orthographic projections of the third transfer wires onto the base substrate are separated from the orthographic projections of the dummy patterns onto the base substrate.

12. The display panel according to claim 11, further comprising a transparent wire layer between the first metal layer and the anode layer, wherein the transparent wire layer comprises transparent wires and first dummy wires extending along the first direction, the transparent wires are separated from the first dummy wires, and the transparent wire layer further comprises a plurality of second dummy wires extending along the second direction; and wherein each anode is coupled to one of the transparent wires through an anode hole, the transparent wires are coupled to the pixel circuits in the pixel circuit region, and the first dummy wires and the second dummy wires are connected.

13. The display panel according to claim 1, wherein the sub-pixels corresponding to each of the pixel units comprise two green sub-pixels, one red sub-pixel, and one blue sub-pixel, the two green sub-pixels are arranged along the second direction, and an effective light-emitting area of the blue sub-pixel is located between effective light-emitting areas of the two green sub-pixels in the second direction; and wherein center lines of the effective light-emitting areas of the two green sub-pixels along the second direction approximately coincide, and the effective light-emitting areas of the blue sub-pixel and an effective light-emitting areas of the red sub-pixel are located on a same side of the center line.

14. A display device, comprising the display panel according to claim 1, and a camera arranged in the light-transmitting region.

15. A method for manufacturing a display panel, used to manufacture the display panel according to claim 1, wherein the method comprises forming a cathode, and the forming the cathode comprises:

forming a cathode material layer;

burning the cathode material layer with a laser to pattern the cathode material layer; and removing residual particles from the cathode material layer by using a plasma air knife.

16. The method according to claim 15, wherein the burning the cathode material layer with the laser to pattern the cathode material layer comprises:
- setting the display substrate comprising the cathode material layer on a processing platform of a laser etching device;
- capturing an alignment mark on the display substrate by using the laser etching device; and
- burning the cathode material layer with the laser based on a position of the alignment mark and a position of the cathode, to pattern the cathode material layer as a cathode pattern.

* * * * *